United States Patent [19]
Yatim et al.

[11] Patent Number: 5,384,807
[45] Date of Patent: Jan. 24, 1995

[54] ADPCM TRANSCODER WITH INTEGRAL TONE GENERATION AND METHOD THEREFOR

[75] Inventors: David Yatim; Luis A. Bonet; Jose G. Corleto, all of Austin, Tex.; Michael D. Floyd, Plainfield, Ind.

[73] Assignee: Motorola, Inc., Schaumburg, Ill.

[21] Appl. No.: 908,198

[22] Filed: Jul. 2, 1992

[51] Int. Cl.⁶ .......................................... H04B 14/06
[52] U.S. Cl. .................... 375/27; 370/110.2; 379/418
[58] Field of Search ............... 375/27, 28; 370/110.2, 370/62, 110.1, 58.1, 68, 68.1; 379/418; 358/133, 135; 348/409, 410

[56] References Cited

U.S. PATENT DOCUMENTS 4,972,466  11/1990  Quesnel et al. ............... 379/418
5,054,021  10/1991  Epps ............................. 370/62

OTHER PUBLICATIONS

"40,32,24, 16kbit/s Adaptive Differential Pulse Code Modulation (ADPCM)," CCITT Recommendation G.726, Geneva, 1990.
"MPT 1375, Common Air Interface Specification," Department of Trade and Industry, London, 1989.
"MC145532 ADPCM Transcoder Product Preview," In Motorola Telecommunications Device Data, DL 136, Rev. 2, Motorola, Inc., 1989.
"MC145554/MC145557/MC145564/MC145567 PCM Codec-Filger," in Motorola Telecommunications Device Data, DL 136, Rev. 2, Motorola, Inc., 1989.
"Motorola MC14410 2-of-8 Tone Encoder," in Motorola Telecommunciations Device Data, DL 136, Rev. 2, Motorola, Inc., 1989.

Primary Examiner—Stephen Chin
Assistant Examiner—Hai H. Phan
Attorney, Agent, or Firm—Paul J. Polansky

[57] ABSTRACT

An ADPCM transcoder (60) includes an integral tone generator (65) which inserts a linear tone signal, such as a conventional DTMF tone signal, into either the transmit or receive data stream, or both. A digital PCM input signal is first converted to a first linear signal. If tone generation is enabled for transmission, then the linear tone signal is substituted for or added to the first linear signal and provided to an ADPCM encoder (63), which provides an ADPCM output signal in response. An ADPCM decoder (66) receives an ADPCM input signal and provides a second linear input signal in response. If tone generation is enabled for reception, then the linear tone signal is substituted for or added to the second linear input signal, and converted to a digital PCM output signal. The ADPCM transcoder (60) may also be integrated with other components of a signal processing system.

39 Claims, 5 Drawing Sheets

ADPCM TRANSCODER WITH INTEGRAL TONE GENERATION AND METHOD THEREFOR

CROSS REFERENCE TO RELATED, COPENDING APPLICATION

Related, copending application is application Ser. No. 07/810,775, filed Dec. 17, 1991, now U.S. Pat. No. 5,259,001, issued Nov. 2, 1993, by Jose G. Corleto, Luis A. Bonet, and David Yatim, entitled "ADPCM Decoder with an Integral Digital Receive Gain and Method Therefor," and assigned to the assignee hereof.

FIELD OF THE INVENTION

This invention relates generally to signal processing systems, and more particularly, to adaptive differential pulse code modulation (ADPCM) transcoders with integral tone generation and related systems and methods.

BACKGROUND OF THE INVENTION

Wireless telephone communication has become a leading growth industry in the late twentieth century. Innovations in electronics have made such communication inexpensive enough for many to afford. One such system for wireless telephony is specified by the U.K. Cordless Telephone, Second Generation (CT-2) standard. CT-2 specifies such functions as how the analog signals from a cordless telephone handset are digitized, encoded, and modulated by a radio frequency (RF) carrier to be transmitted to a base station. A CT-2 telephone handset receives an analog voice signal from a microphone. The voice signal is converted to PCM, processed through an ADPCM encoder (which conforms to CCITT Recommendation G.721), and then modulated and transmitted (along with other signalling information) according to the CT-2 Common Air Interface (CAI) standard to a base station. Transmit and receive signals are sent and received to and from the base station in packets in a half-duplex fashion. For signal reception, a packet is received, demodulated, processed through a G.721 ADPCM decoder, converted from digital PCM to analog, and then provided to a speaker.

In order for CT-2 cordless telephones to be affordable by a large number of people, it is necessary to minimize the cost of the handset. Modern electronics has made several of the functions required by the CT-2 handset available through inexpensive integrated circuits. For example, the Motorola MC14410 2-of-8 Tone Encoder, the Motorola MC145532 ADPCM Transcoder, and either the Motorola MC145554 μ-law PCM Codec-Filter or the Motorola MC145557 A-law PCM Codec-Filter may be used to implement a substantial part of the function of a CT-2 handset. These commercial integrated circuits provide an inexpensive, highly integrated telephone handset. However, as time goes on further cost reductions are necessary in order to make the CT-2 system attractive to more and more consumers.

SUMMARY OF THE INVENTION

Accordingly, there is provided, in one form, an adaptive differential pulse code modulation (ADPCM) transcoder with integral tone generation comprising tone generation means, pulse code modulation-(PCM) to-linear conversion means, first tone insertion means, and encoder means. The tone generation means provides a linear tone signal having at least one tone frequency associated therewith. The PCM-to-linear conversion means converts a PCM input signal to a first linear signal. The first tone insertion means provides a second linear signal as a predetermined one of either the linear tone signal, or a sum of the first linear signal and the linear tone signal, in response to a first control signal. The encoder means receives the second linear signal, and performs adaptive differential pulse code modulation encoding thereon to provide an ADPCM output signal.

In another form, there is provided an ADPCM transcoder with integral tone generation comprising tone generation means, decoder means, tone insertion means, and linear-to-PCM conversion means. The tone generation means provides a linear tone signal having at least one tone frequency associated therewith. The decoder means receives an ADPCM input signal, and performs adaptive differential pulse code modulation decoding thereon to provide a first linear signal. The tone insertion means provides a second linear signal as a predetermined one of either the linear tone signal, or a sum of the first linear signal and the linear tone signal, in response to a control signal. The linear-to-PCM conversion means converts the second linear signal to a PCM output signal.

In still another form, there is provided a method for generating a tone integrally within an ADPCM transcoder, comprising the steps of generating a linear tone signal having at least one tone frequency associated therewith; converting a digital PCM input signal to a first linear signal; selecting one of the first linear signal and the linear tone signal to provide a first selected signal; providing said first selected signal to an input of an ADPCM encoder; providing an output of the ADPCM encoder as an ADPCM output signal; receiving an ADPCM input signal at an input of an ADPCM decoder; selecting one of, a second linear signal at an output of the ADPCM decoder, and the linear tone signal to provide a second selected signal; and converting said second selected signal to a digital PCM output signal.

These and other features and advantages will be more clearly understood from the following detailed description taken in conjunction with the accompanying drawings.

DETAILED DESCRIPTION OF A PREFERRED EMBODIMENT

Figure 1:
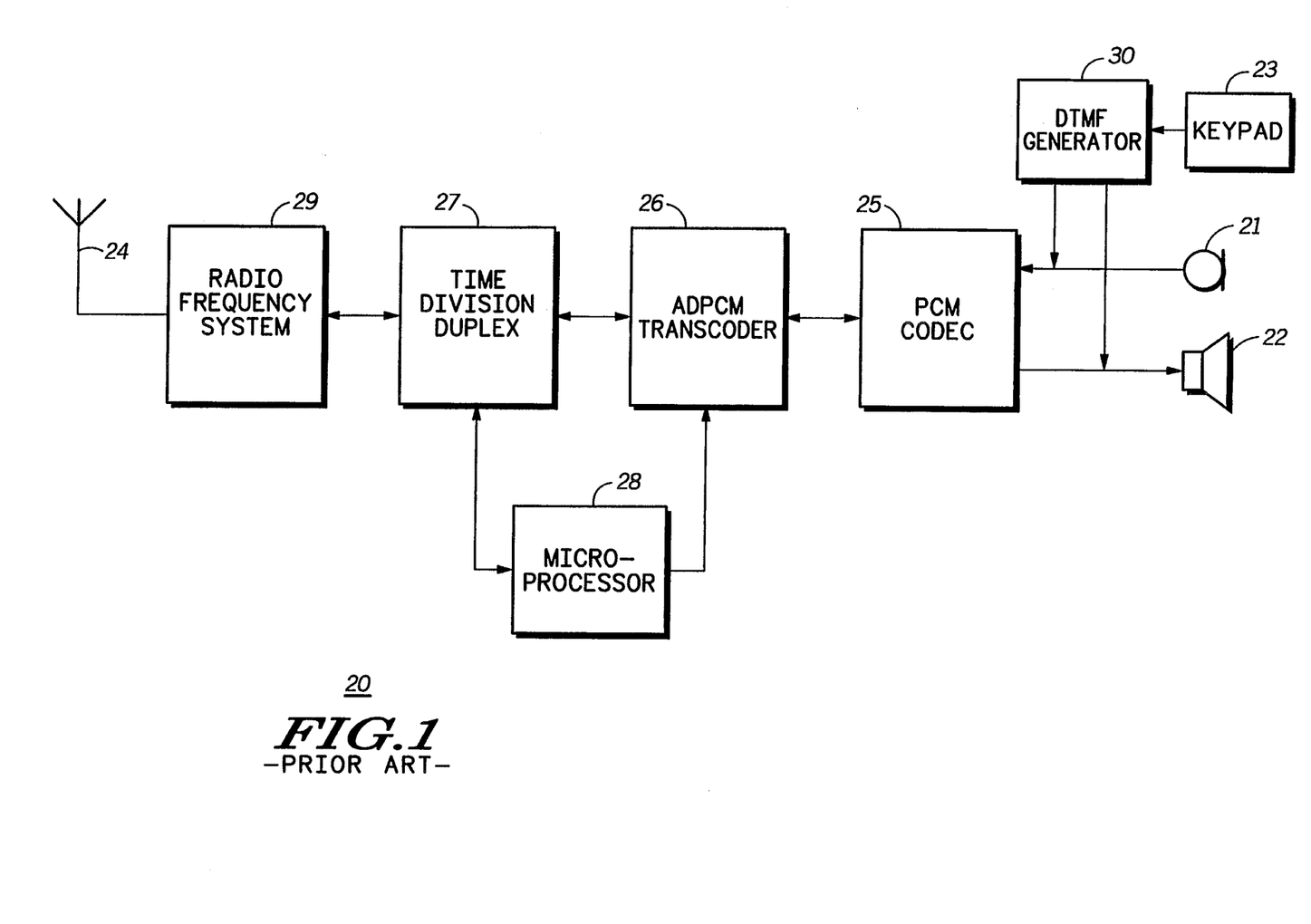
FIG. 1 illustrates in partial block diagram and partial logic diagram form a CT-2 telephone handset according to the prior art.

FIG. 1 illustrates in partial block diagram and partial logic diagram form a CT-2 telephone handset 20 according to the prior art. Handset 20 conforms to the CT-2 standard. According to the CT-2 standard, telephone signals are received and transmitted digitally in packets in a half-duplex scheme between handset 20 and a base station (not shown in FIG. 1). An interface between the user and the handset is formed through a microphone 21, a speaker 22, and a keypad 23. An interface between the CT-2 handset and the base station is formed through an antenna 24. Antenna 24 is used for transmitting and receiving radio-frequency (RF) representations of telephonic signals. As used here, the term "signal" refers to a time-varying electrical signal, and the term "digital signal" refers to a series of digital samples of the signal. A "packet" includes a portion of the digital signal, or alternatively, a specified number of digital samples of the telephone signal, along with digital signalling bits.

Microphone 21 provides an analog voice signal to a PCM codec 25. PCM codec 25 receives the analog voice signal from microphone 21, bandpass filters the analog signal, converts the bandpass-filtered signal to a 64 kilobit-per-second (kbps) digital signal, and provides the 64 kbps digital PCM signal to an ADPCM transcoder 26. PCM codec 25 also receives a 64 kbps digital PCM signal from ADPCM transcoder 26, converts it to an analog signal, lowpass filters the analog signal, and provides the lowpass-filtered signal to speaker 22. PCM codec 25 may be implemented as a conventional integrated circuit, such as the Motorola MC145554 $\mu$-law PCM Codec-Filter or the Motorola MC145557 A-law PCM Codec-Filter.

Functionally, ADPCM transcoder 26 includes an ADPCM encoder function and an ADPCM decoder function (not shown). The ADPCM encoder compresses the 64 kbps digital telephone signal to a 32 kbps signal according to the CCITT Recommendation G.721 standard and provides the ADPCM signal to a time division duplex block 27. CCITT Recommendation G.726 allows for the conversion of a 64 kilobit-per-second (kbps) pulse code modulation (PCM) channel to and from a 40, 32, 24, or 16 kbps ADPCM channel. The CT-2 standard specifies the use of G.721 encoding and decoding, which is equivalent to G.726 encoding and decoding at 32 kbps.

Time division duplex block 27 then combines signalling bits from a microprocessor 28 with the compressed digital data from ADPCM transcoder 26 to form a CT-2 packet. Time division duplex block 27 provides the CT-2 packet to a radio frequency system 29, which modulates it and provides it as an RF signal to antenna 24, where it is radiated and eventually received by the base station. The modulation scheme is a two-level FSK shaped by an approximately Gaussian filter, as described in the CT-2 CAI Specification.

For reception, a packet from the base station is received as a modulated RF signal on antenna 24. Radio frequency system 29 receives the RF signal and demodulates it. The packet is then presented to time division duplex block 27. Time division duplex block 27 splits the packet into its two constituent components, making signalling bits available to microprocessor 28 and the compressed digital signal available to ADPCM transcoder 26. Subsequently, microprocessor 28 reads the signalling bits and performs associated signalling functions, such as call setup and disconnect.

The ADPCM decoder function decompresses the compressed digital signal received from time division duplex block 27. In the illustrated embodiment, as part of a CT-2 handset, the ADPCM decoder function conforms to CCITT Recommendation G.721. The ADPCM decoder function converts the 32 kbps ADPCM digital signal to 64 kbps PCM according to standard G.721 ADPCM. ADPCM transcoder 26 is connected to microprocessor 28, which initializes and controls the operation thereof. PCM codec 25 receives the PCM data, performs A-law or $\mu$-law decompression, digital-to-analog conversion, and lowpass filtering to form an analog voice signal, and provides the analog voice signal to speaker 22 and a ringer (not shown in FIG. 1).

Keypad 23 provides an interface to the user for such functions as destination telephone number entry, remote telephone signalling, and the like. Keypad 23 includes keys located at intersections of a four-by-four array. Each key is located at a unique intersection of a row and a column. In response to a key being depressed, a dual-tone, multi-frequency (DTMF) generator 30 senses the key's row and column, and generates a signal having a first tone signal corresponding to the selected row and a second tone signal corresponding to the selected column. DTMF generator 30 provides the signal to the analog input of PCM codec 25 for insertion into the signal stream, and to speaker 22 for echoing to the user.

The blocks of handset 20 may be implemented with conventional integrated circuits. For example, the Motorola MC14410 2-of-8 tone encoder may be used to implement DTMF generator 30; either the Motorola MC145554 $\mu$-law PCM Codec-Filter or the Motorola MC145557 A-law PCM Codec-Filter may be used to implement PCM codec 25; and the Motorola MC145532 ADPCM Transcoder may be used to implement ADPCM transcoder 26.

Figure 2:
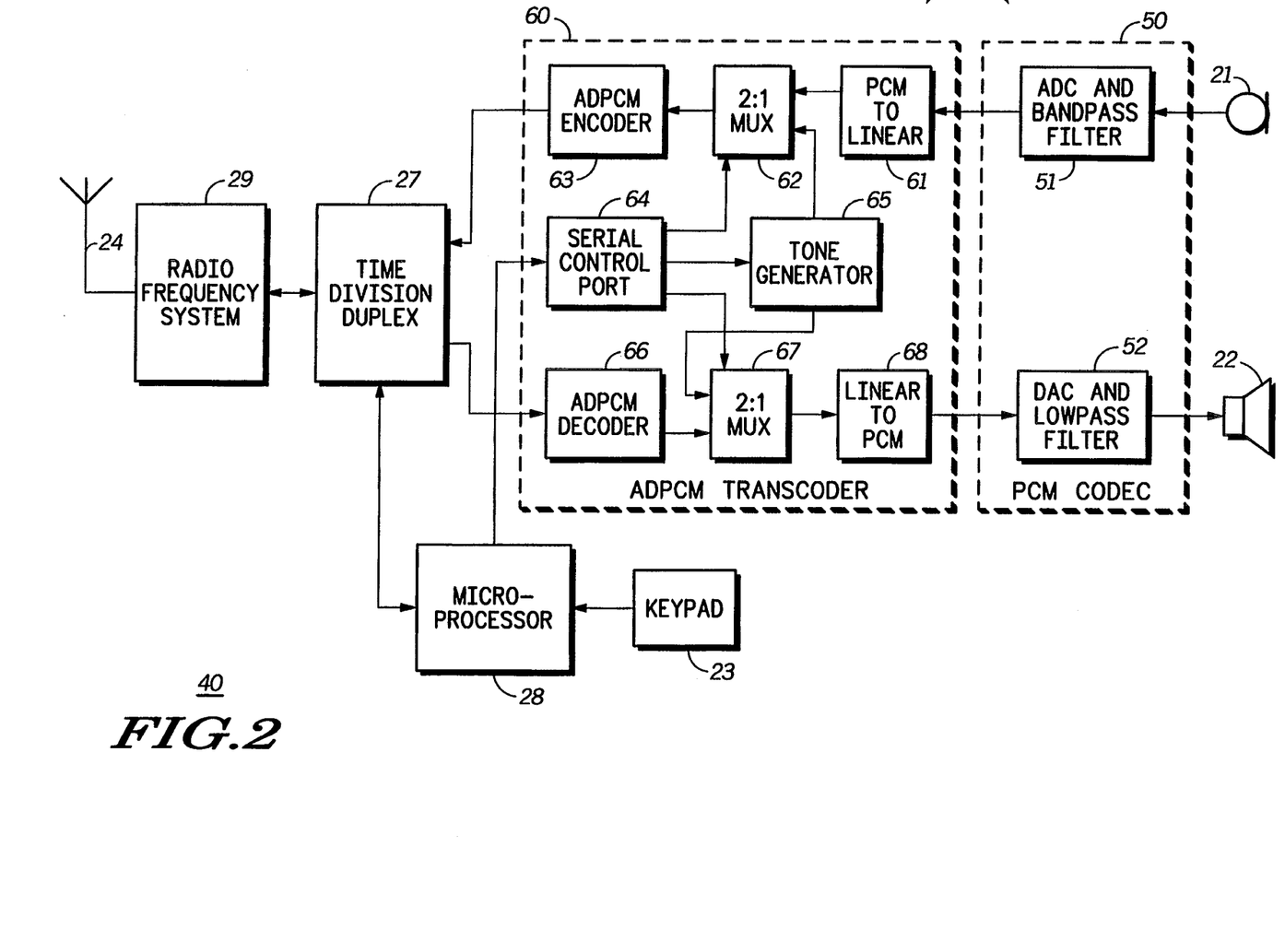
FIG. 2 illustrates in partial block diagram form and partial logic diagram form a CT-2 telephone handset having an ADPCM CODEC with an integral tone generator in accordance with the present invention.

FIG. 2 illustrates in partial block diagram form and partial logic diagram form a CT-2 telephone handset 40 having an ADPCM CODEC with an integral tone generator in accordance with the present invention. Elements in common with FIG. 1 retain their previously-assigned reference numbers. Handset 40 includes as common elements microphone 21, speaker 22, and keypad 23; antenna 24; and time division duplex block 27, microprocessor 28, and RF system 29. However, handset 40 includes an ADPCM CODEC with integral tone generation 42 which is implemented as a single integrated circuit. ADPCM CODEC 42 includes generally a PCM codec 50 and an ADPCM transcoder 60.

PCM codec 50 further includes an analog-to-digital converter (ADC) and bandpass filter 51, and a digital-to-analog converter (DAC) and lowpass filter 52. ADC and bandpass filter 51 receives the analog voice signal from microphone 21, bandpass filters the analog voice signal, and provides a 64-kbps digital PCM signal in response. DAC and lowpass filter 52 receives a 64-kbps digital PCM signal, converts the 64-kbps digital PCM signal to an analog signal, and lowpass filters the analog signal to provide an output signal to speaker 22.

ADPCM transcoder 60 includes a PCM-to-linear converter 61, a multiplexer 62, an ADPCM encoder 63, a serial control port (SCP) 64, a tone generator 65, an ADPCM decoder 66, a multiplexer 67, and a linear-to-PCM converter 68. PCM-to-linear converter 61 has an input connected to the output of ADC and bandpass filter 51, and an output. Multiplexer 62 is a two-to-one (2:1) multiplexer having a first input terminal connected to the output terminal of PCM-to-linear converter 61, a second input terminal, a control input terminal, and an output terminal. ADPCM encoder 63 has an input terminal connected to the output terminal of multiplexer 62, and an output terminal. ADPCM encoder 63 performs CCITT Recommendation G.721 adaptive differential pulse code modulation (ADPCM) compression to provide a compressed ADPCM signal at 32 kbps at the output thereof.

Serial control port (SCP) 64 is connected to microprocessor 28 for providing a serial data interface therebetween, and includes registers for storing control information associated with the operation of ADPCM CODEC 42. SCP 64 has three outputs, including one output connected to the control input of multiplexer 62, and a second output connected to an input of tone generator 65. Tone generator 65 provides two outputs, including one output connected to the second input terminal of multiplexer 62. The two outputs are numerically identical, but are represented as separate signals to correspond to the way in which a data processor (not shown) performs the functions of ADPCM transcoder 60 in microcode.

ADPCM decoder 66 has an input for receiving a 32 kbps ADPCM-encoded signal from time division duplex block 27. ADPCM decoder 66 performs 32 kbps G.721 ADPCM expansion, and provides a 64 kbps linear output signal at an output terminal thereof. Multiplexer 67 has a first input terminal connected to the output terminal of ADPCM decoder 66, a second input terminal connected to a second output terminal of tone generator 65, a control input terminal connected to a third output terminal of SCP 64, and an output terminal. Linear-to-PCM converter 68 has an input terminal connected to the output terminal of multiplexer 67, and an output terminal for providing a 64 kbps digital PCM signal to DAC and lowpass filter 52.

ADPCM transcoder 60 has two configurations. If no tone is to be inserted into the signal stream, then SCP 64 disables tone generator 65, and provides control signals at its first and third output terminals to enable the first inputs of both multiplexer 62 and multiplexer 67. In this case, ADPCM transcoder 60 performs as if tone generator 65 were absent.

However, if a key in keypad 23 is depressed, a dual tone (corresponding to its row and column location of keypad 23) is to be sent. Microprocessor 28 detects the row and column of the depressed key on keypad 23 and transmits control signals to SCP 64 signifying which tone frequencies are to be inserted. SCP 64 then changes the flow of data in ADPCM transcoder 60 by enabling the second inputs of multiplexers 62 and 67. SCP 64 also signals tone generator 65 to enable tone generation and indicates which tones are to be inserted. Tone generator 65 inserts the two tones into the signal stream in response.

FIG. 2 designates the various signal processing functions of ADPCM transcoder 60 generally to emphasize the applicability to various signal processing systems. However, it is also important to understand how the blocks of ADPCM transcoder 60 correspond to the various blocks of the ADPCM encoder and ADPCM decoder described in the G.726-1990 standard. PCM-to-linear converter 61 corresponds to the G.726 "input PCM format conversion" block. G.726 designates the input signal of PCM-to-linear converter 61 as "s(k)", and the output signal as "$s_l(k)$". Multiplexer 62 receives signal sl(k) at its first input terminal and the linear tone signal at its second input terminal, and provides a modified version of signal $s_l(k)$ at its output terminal. ADPCM encoder 63 includes all the blocks of a G.726 ADPCM encoder besides the input PCM format conversion block.

For decoding, linear-to-PCM converter 68 corresponds to the G.726 "output format PCM conversion" and "synchronous coding adjustment" blocks; ADPCM decoder 66 includes the other blocks of a G.726 ADPCM decoder besides the output PCM format conversion and synchronous coding adjustment blocks. Thus, multiplexer 67 receives G.726 signal "$s_r(k)$" at its first input terminal, the linear tone signal at its second input terminal, and provides a modified version of signal $s_r(k)$ at its output terminal. In the illustrated embodiment, linear-to-PCM converter 68 also includes an integral digital receive gain, as disclosed by Jose G. Corleto, Luis A. Bonet, and David Yatim, in U.S. patent application Ser. No. 07/810,775, filed Dec. 17, 1991 and assigned to the assignee hereof, now U.S. Pat. No. 5,259,001, issued Nov. 2, 1993, entitled "ADPCM Decoder with an Integral Digital Receive Gain and Method Therefor," which is herein incorporated by reference.

Figure 6:
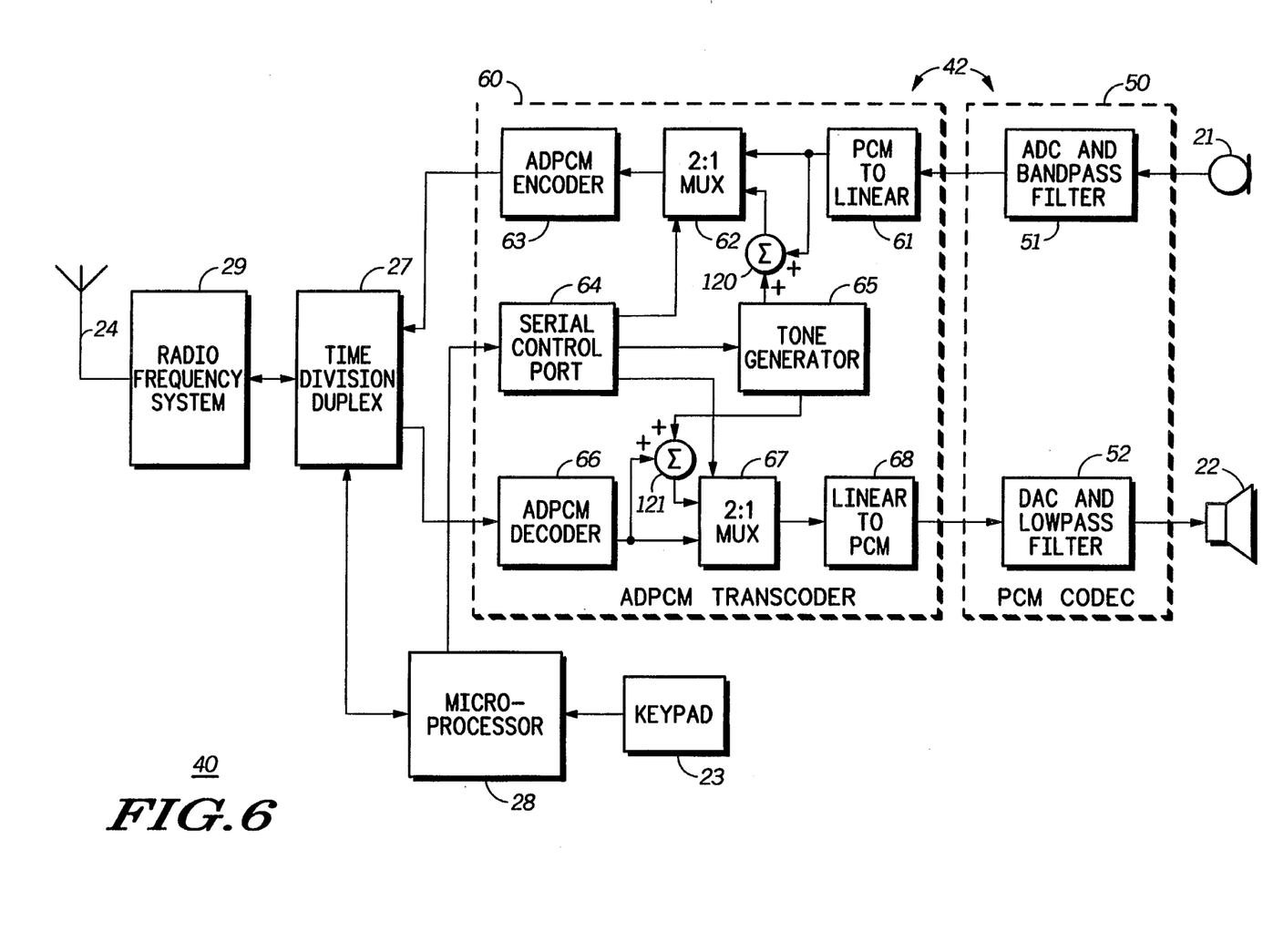
FIG. 6 illustrates in partial block diagram form and partial logic diagram form an alternate embodiment of the CT-2 handset of FIG. 2.

In the illustrated embodiment, PCM codec 50 is implemented as hardware circuitry, while the blocks of ADPCM transcoder 60 represent functions performed by a data processor (not shown in FIG. 2). It should be apparent that the functions of ADPCM transcoder 60 may be implemented through hardware, software, or a combination of the two. Note also that multiplexers 62 and 67 select either the digitized voice signal or the tone signal; however in other embodiments, the tone signal may be inserted into the signal stream by adding or otherwise combining the tone signal to the digitized voice signal, as illustrated in FIG. 6. FIG. 6 illustrates an alternate embodiment of the CT-2 handset of FIG. 2 in which reference numbers for elements in common with FIG. 2 are retained. In the embodiment illustrated in FIG. 6, a summing device 120 has a first input connected to the output terminal of PCM-to-linear converter 61, a second input for receiving the first output of tone generator 65, and an output connected to the second input terminal of multiplexer 62. Likewise, a summing device 121 has a first input connected to the output terminal of ADPCM decoder 66, a second input for receiving the second output of tone generator 65, and an output connected to the second input terminal of multiplexer 67.

By inserting tone signals into the transmit and receive signal streams within ADPCM transcoder 60, signal processing system 40 reduces integrated circuit count (and hence cost) below that of signal processing system 20 of FIG. 1. In signal processing system 40, ADPCM CODEC 42 represents a separate integrated circuit. However, the advantages of integral tone generation are also realized by other combinations of elements integrated together in the same integrated circuit. In particular, the combination of microprocessor 28 and ADPCM codec 42 in a single integrated circuit further increases integration over signal processing system 20 of FIG. 1. Time division duplex block 27 may also be included in the integrated circuit to further improve integration.

Figure 3:
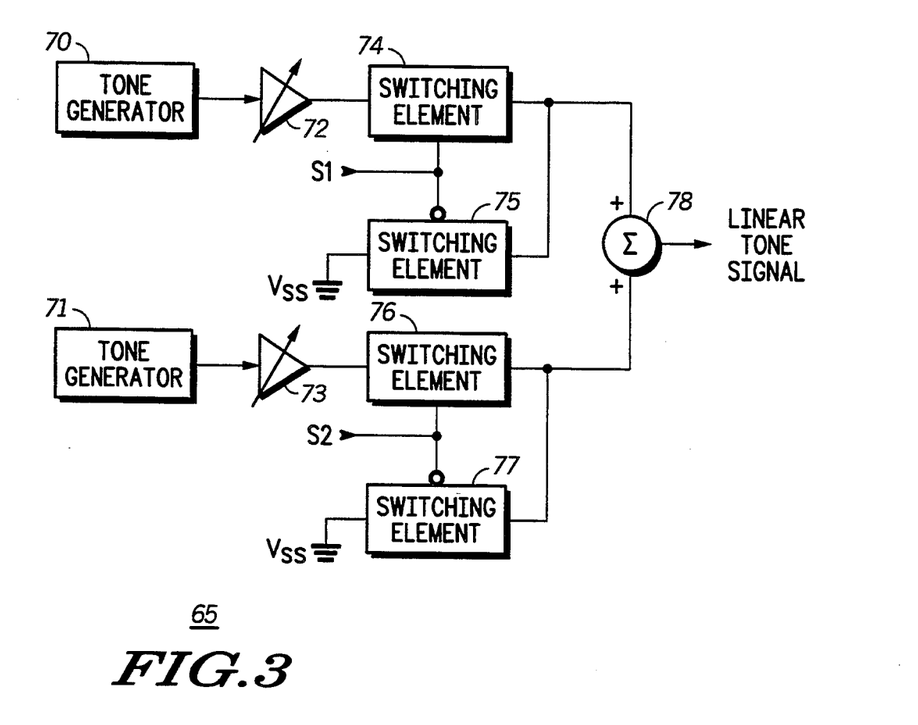
FIG. 3 illustrates in partial block diagram form and partial logic diagram form the tone generator of FIG. 2.

FIG. 3 illustrates in partial block diagram form and partial logic diagram form tone generator 65 of FIG. 2.

Tone generator 65 includes two independent tone generators 70 and 71 which may be used to implement standard DTMF telephone signalling by combining the two tones. However, each tone generator may be individually included to accommodate other tone-based signalling schemes. Tone generator 70 provides a tone signal to an input of a variable-gain amplifier 72. The output of variable-gain amplifier 72 is connected to an input of a switching element 74. An input of a second switching element 75 is connected to a ground power supply voltage terminal labelled "$V_{SS}$". Switching element 74 is activated by a control signal labelled "S1" being in a logic high state, whereas switching element 75 is activated by control signal S1 being in a logic low state. Outputs of switching elements 74 and 75 are wire ORed together and the output terminals are connected to a first input terminal of a summing device 78. Note that switching elements 74 and 75 may be implemented in a variety of ways including hardware switches such as transistors, and software.

Similarly, tone generator 71 provides an output to an input of a variable-gain amplifier 73. The output of variable-gain amplifier 73 is connected to an input of a third switching element 76. An input of a fourth switching element 77 is connected to $V_{SS}$. Switching element 76 is activated by a control signal labelled "S2" being in a logic high state, whereas switching element 77 is activated by control signal S2 being in a logic low state. Outputs of switching elements 76 and 77 are wire ORed together and the output terminals are connected to a second input terminal of summing device 78. The output of summing device 78 provides the output of tone generator 65, labelled "LINEAR TONE SIGNAL". Because it includes two tone generators 70 and 71, tone generator 65 conveniently implements DTMF, but since each tone signal is separately switched, tone generator 65 may be used to implement non-DTMF signalling.

Each of the functions of tone generator 65 of FIG. 3 may be implemented in hardware, in software, in microcode running on a data processor, or a combination thereof. One known way to implement tone generators 70 and 71 is to read out values stored in a read-only memory (ROM). The values correspond to samples of a sinusoidal signal. Different frequencies result from varying the incremental step between consecutive samples from the ROM. However, a large ROM is required to implement the sinusoidal signal with acceptable resolution and signal-to-noise ratio. In the illustrated embodiment, tone generators 70 and 71 each implement a infinite impulse response (IIR) filter resonator through microcode running on a data processor (not shown in FIG. 3) to eliminate the area required for a ROM and to make use of unused processing capability. The operation of tone generators 70 and 71 are more particularly understood with reference to FIG. 4.

Figure 4:
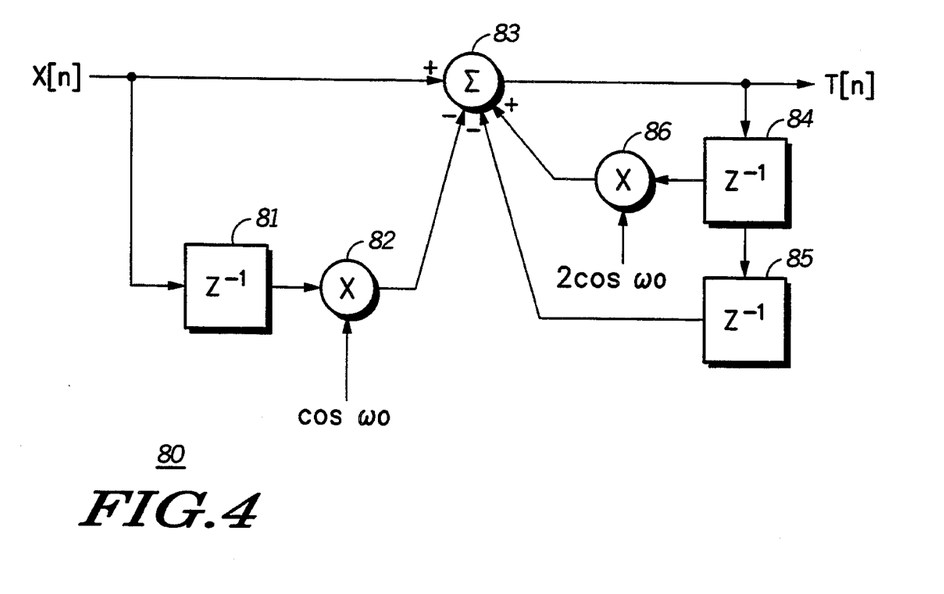
FIG. 4 illustrates a signal processing diagram of a digital filter associated with each tone generator of FIG. 3.

FIG. 4 illustrates a signal processing diagram of a digital filter 80 associated with tone generators 70 and 71 of FIG. 3. Digital filter 80 is an IIR filter whose impulse response is the Z transform of a cosine function. A signal labelled "X[n]" provides an initial excitation to digital filter 80. Digital filter 80 begins oscillation in response to a non-zero value for X[0]. Thereafter, X[n] is equal to zero. X[n] is provided to an adding input of a summing device 83. X[n] is also provided to an input terminal of a delay element 81 which is labelled "$Z^{-1}$". Delay element 81 provides an output which is delayed by one clock period of digital filter 80. The output of delay element 81 is provided as an input to a multiplier 82. A second input of multiplier 82 receives an input equal to the cosine of the desired frequency, labelled "cos $\omega_0$". The output of multiplier 82 is provided to a subtracting input of summing device 83. Summing device 83 provides a signal labelled "T[n]", which is a digital sample of a tone at a desired frequency. A delay element 84 receives signal T[n]. A multiplier 86 receives an output of delay element as one input and a second input equal to 2cos$\omega_0$ and provides an output to an adding input of summing device 83. A delay element 85 also receives the output of delay element 84 and provides an output to a subtracting input of summing device 83.

If standard DTMF tone generation is desired, then digital filter 80 can be initialized to provide tone signal T[n] at a frequency of either 697 Hz, 770 Hz, 852 Hz, or 941 Hz for a row tone, or at a frequency of 1209 Hz, 1336 Hz, 1477 Hz, or 1633 Hz for a column tone. In ADPCM transcoder 60, two digital filters each identical to digital filter 80 are used respectively to implement tone generators 70 and 71. Tone generators 70 and 71 are implemented in microcode running on a data processor (not shown in FIG. 2). However, digital filter 80 may be implemented completely in hardware or in a combination of hardware or microcode.

Figure 5:
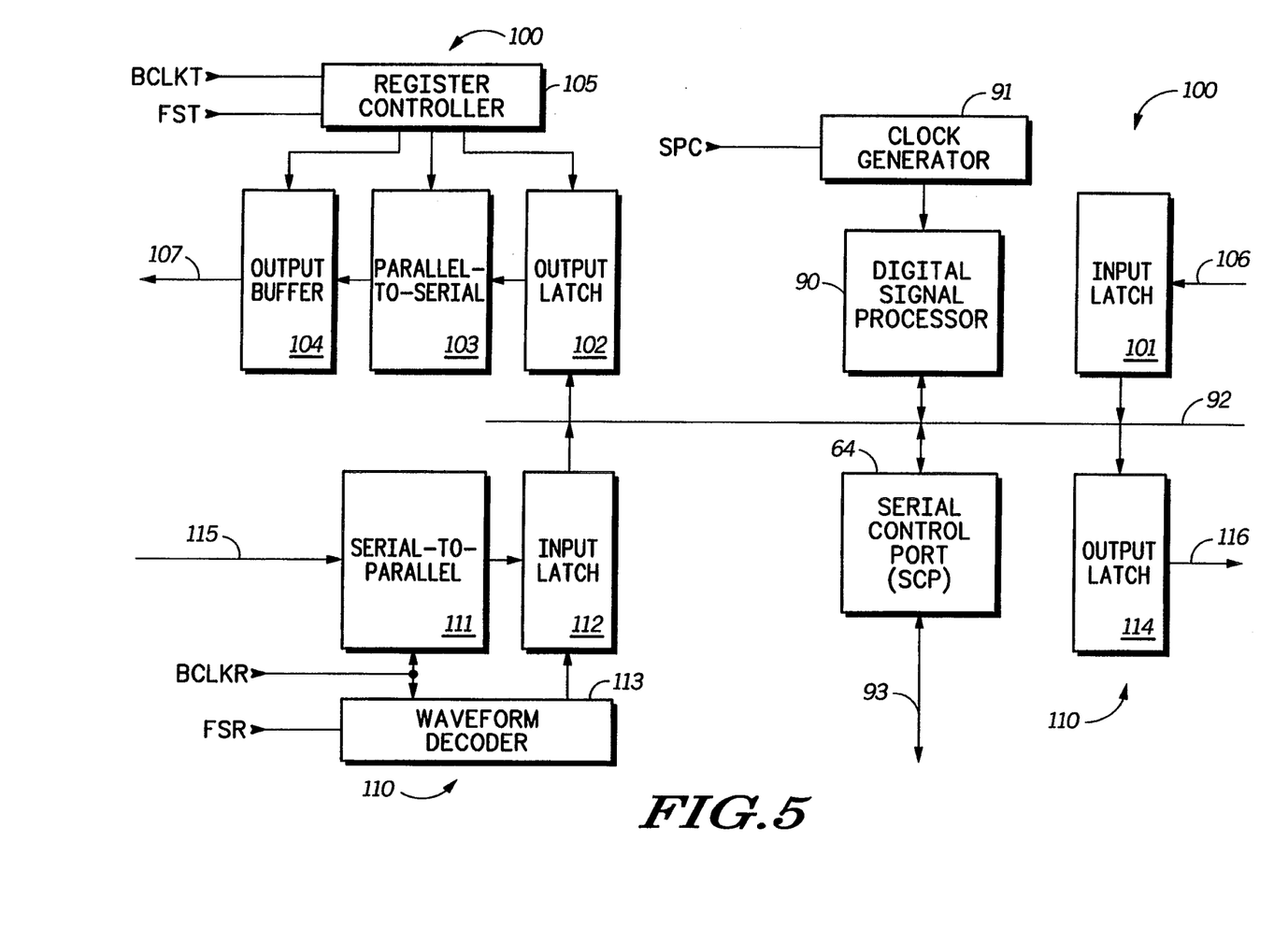
FIG. 5 illustrates a block diagram of the ADPCM transcoder with integral tone generation of FIG. 2 useful in understanding the operation thereof.

FIG. 5 illustrates a block diagram of ADPCM transcoder with integral tone generation 60 of FIG. 2 useful in understanding the operation thereof. It should be noted that FIG. 5 depicts ADPCM transcoder 60 according to functional blocks representative of hardware circuitry. By contrast, FIG. 2 illustrates a functional block diagram of ADPCM transcoder 60. FIG. 5 clarifies how the functions of ADPCM transcoder 60 are shared by hardware circuitry and microcode executed by a data processor. FIG. 5 illustrates SCP 64, a digital signal processor 90, a clock generator 91, an encoder portion 100, a decoder portion 110.

DSP 90 is connected to a bidirectional communications bus 92 for receiving data therefrom and providing data thereto. Clock generator 91 receives a signal labelled "SPC" which is the output of a crystal oscillator external to ADPCM CODEC 42 (not shown). Clock generator 91 is connected to DSP 90 and provides a clock signal thereto. Serial control port (SCP) 64 is also connected to communications bus 92. SCP 64 is connected to microprocessor 28 of FIG. 2 via signal lines 93. SCP 64 allows microprocessor 28 to initialize and control the operation of ADPCM transcoder 26.

Encoder portion 100 includes an input latch 101, an output latch 102, a parallel-to-serial block 103, an output buffer 104, and a register controller 105. Input latch 101 is connected to PCM codec 50 via input signal lines 106. Input latch 101 latches an 8-bit PCM word from PCM codec 50 and provides the data to DSP 90 via communications bus 92. DSP 90 performs the function of a 32 kbps G.721 ADPCM encoder through microcode. DSP 90 also provides ADPCM data words via communications bus 92 to output latch 102. The ADPCM data word may be either 8, 4, 3, or 2 bits corresponding to a data rate of either 64, 32, 24, or 16 kbps, respectively. In the CT-2 handset, however, a data word of 4 bits corresponding to the G.721 32 kbps data rate is used. Parallel-to-serial block 103 is connected to output latch 102 and provides an ADPCM data word serially to output buffer 104, which provides the data to time division duplex block 27 of FIG. 2 via signal lines 107. Register controller 105 is connected to, and controls the operation of, output latch 102, parallel-to-serial block 103, and output buffer 104 in response to a clock input signal labelled "BCLKT" and a control signal labelled "FST".

Decoder portion 110 includes a serial-to-parallel block 111, an input latch 112, a waveform decoder 113, and an output latch 114. Serial-to-parallel block 111 receives an ADPCM-encoded stream of data bits from time division duplex block 27 via input signal lines 115, combines the data into ADPCM data words, and provides the data words to input latch 112. Input latch 112 stores ADPCM data one word at a time and makes the ADPCM data word available to DSP 90. Waveform decoder 113 receives input signals labelled "FSR" and "BCLKR". Signal BCLKR clocks the received data, and signal FSR determines the operating mode. Together, signals BCLKR and FSR determine operation at a data rate of either 64, 32, 24, or 16 kbps. In the CT-2 handset, however, a data word of 4 bits corresponding to the G.721 32 kbps data rate is used. DSP 90 performs the function of a G.721 ADPCM decoder as illustrated in FIG. 2 in microcode. DSP 90 provides a digital PCM signal to output latch 114, which subsequently provides it to PCM codec 50 via a signal line 116.

ADPCM transcoder 60 performs the tone generation (as illustrated in FIGS. 2, 3, and 4), multiplexing, and data conversion through microcode running on DSP 90. Because DSP 90 implements tone generation without the need for a ROM, this method is preferred. Other embodiments may implement other combinations of the illustrated functions through hardware and/or software. For example, DTMF tone generators are well known and may be used in place of the microcode implementation to realize tone generator 65 of FIG. 2.

While the invention has been described in the context of a preferred embodiment, it will be apparent to those skilled in the art that the present invention may be modified in numerous ways and may assume many embodiments other than that specifically set out and described above. As previously noted above, the functions of ADPCM transcoder 60 may be performed in hardware, software, microcode running on a data processor, or some combination thereof. While a CT-2 handset using 32 kbps G.721 ADPCM encoding and decoding was illustrated, in other embodiments other G.726 data rates may be used. While APDCM transcoder 60 performed tone generation for both the transmit and receive signal streams, in other embodiments it may be desirable to perform tone generation on one or the other, but not both. Also while ADPCM CODEC 42 was illustrated as being a single integrated circuit, in other embodiments different elements of signal processing system 40 may be combined in integrated circuit form. For example, microprocessor 28 may be combined with ADPCM CODEC 42 to form an integrated circuit, with or without time division duplex block 27. Accordingly, it is intended by the appended claims to cover all modifications of the invention which fall within the true spirit and scope of the invention.

We claim:

1. An adaptive differential pulse code modulation (ADPCM) transcoder with integral tone generation comprising:

a tone generator for providing a linear tone signal having at least one tone frequency associated therewith in response to a first control signal received at a control input terminal thereof;

a pulse code modulation-(PCM-) to-linear converter having an input terminal for receiving a PCM input signal, and an output terminal;

a first multiplexer having a first input terminal coupled to said output terminal of said PCM-to-linear converter, a second input terminal for receiving said linear tone signal, a control input terminal for receiving a second control signal, and an output terminal;

an ADPCM encoder having an input terminal coupled to said output terminal of said first multiplexer, and an output terminal for providing an ADPCM output signal;

an ADPCM decoder having an input terminal for receiving an ADPCM input signal, and an output terminal;

a second multiplexer having a first input terminal coupled to said output terminal of said ADPCM decoder, a second input terminal for receiving said linear tone signal, a control input terminal for receiving a third control signal, and an output terminal; and a linear-to-PCM converter haivng an input terminal coupled to said output terminal of said second multiplexer, and an output terminal for providing a PCM output signal.

2. The ADPCM transcoder of claim I further comprising a serial control port having an input terminal for providing a microprocessor interface, and a first output terminal coupled to said tone generator and providing said first control signal in response to a first plurality of signals received at said input terminal.

3. The ADPCM transcoder of claim 2 wherein said serial control port further has a second output terminal for providing said second control signal in response to a second plurality of signals received at said input terminal, and a third output terminal for providing said third control signal in response to a third plurality of signals received at said input terminal.

4. An adaptive differential pulse code modulation (ADPCM) transcoder with integral tone generation comprising:

tone generation means for providing a linear tone signal having at least one tone frequency associated therewith;

pulse code modulation-(PCM-)-to-linear conversion means for converting a PCM input signal to a first linear signal;

first tone insertion means for providing a second linear signal as a predetermined one of either said linear tone signal, or a sum of said first linear signal and said linear tone signal, in response to an activation of a first control signal, and for providing said second linear tone signal as said first linear tone signal in response to said first control signal being inactive;

encoder means for receiving said second linear signal, and for performing adaptive differential pulse code modulation encoding thereon to provide an ADPCM output signal.

5. The ADPCM transcoder of claim 4 wherein said first tone insertion means comprises a multiplexer having a first input terminal for receiving said first linear signal, a second input terminal for receiving said sum of aid first linear signal and said linear tone signal, a control input terminal for receiving said first control signal, and an output terminal for providing said second linear signal.

6. The ADPCM transcoder of claim 4 wherein said PCM-to-linear conversion means and said encoder means substantially comply with CCITT Recommendation G.726-1990 for at least one data rate thereof.

7. The ADPCM transcoder of claim 4 further comprising control means for enabling said tone generation means in response to an input signal.

8. The ADPCM transcoder of claim 7 wherein said control means further provides said first control signal selectively in response to said input signal.

9. The ADPCM transcoder of claim 7 wherein said input signal is characterized as being a keypad input signal.

10. The ADPCM transcoder of claim 4 wherein said tone generation means provides a dual-tone, multi-frequency (DTMF) tone signal.

11. (Amended) The ADPCM transcoder of claim 4 wherein said tone generation means comprises:
   a first tone generator for providing a first tone signal;
   a first variable-gain amplifier having an input for receiving said first tone signal, and an output;
   a second tone generator for providing a second tone signal;
   a second variable-gain amplifier having an input for receiving said second tone signal, and an output; and
   switch means for providing said linear tone signal in response to a selected one of said output of said first variable-gain amplifier, said output of said second variable-gain amplifier, or a sum of said outputs of said first and second variable-gain amplifiers.

12. The ADPCM transcoder of claim 11 wherein said first and second tone generators are characterized as being infinite impulse response tone generators.

13. The ADPCM transcoder of claim 4 further comprising:
   decoder means for receiving an ADPCM input signal, and for performing adaptive differential pulse code modulation decoding thereon to provide a third linear signal;
   second tone insertion means for providing a fourth linear signal as a predetermined one of either said linear tone signal, or a sum of said third linear signal and said linear tone signal, in response to a second control signal; and
   linear-to-PCM conversion means for converting said fourth linear signal to a PCM output signal.

14. An adaptive differential pulse code modulation (ADPCM) transcoder with integral tone generation comprising:
   tone generation means for providing a linear tone signal having at least one tone frequency associated therewith;
   decoder means for receiving an ADPCM input signal, and for performing adaptive differential pulse code modulation decoding thereon to provide a first linear signal;
   tone insertion means for providing a second linear signal as a predetermined one of either said linear tone signal, or a sum of said first linear signal and said linear tone signal, in response to an activation of a control signal, and for providing said second linear signal as said first linear signal in response to said control signal being inactive; and
   linear-to-pulse code modulation (PCM) conversion means for converting said second linear signal to a PCM output signal.

15. The ADPCM transcoder of claim 14 wherein said tone insertion means comprises a multiplexer having a first input terminal for receiving said first linear signal, a second input terminal for receiving said sum of said first linear signal and said linear tone signal, a control input terminal for receiving said control signal, and an output terminal for providing said second linear signal.

16. The ADPCM transcoder of claim 14 wherein said decoder means and said linear-to-PCM conversion means substantially comply with CCITT Recommendation G.726-1990 for at least one data rate thereof.

17. The ADPCM transcoder of claim 14 further comprising control means for enabling said tone generation means in response to an input signal.

18. The ADPCM transcoder of claim 17 wherein said control means further provides said control signal selectively in response to said input signal.

19. The ADPCM transcoder of claim 17 wherein said input signal is characterized as being a keypad input signal.

20. The ADPCM transcoder of claim 14 wherein said tone generation means provides a dual-tone, multi-frequency (DTMF) tone signal.

21. The ADPCM transcoder of claim 14 wherein said tone generation means comprises:
   a first tone generator for providing a first tone signal;
   a first variable-gain amplifier having an input for receiving said first tone signal, and an output;
   a second tone generator for providing a second tone signal;
   a second variable-gain amplifier having an input for receiving said second tone signal, and an output; and
   switch means for providing said linear tone signal in response to a selected one of said output of said first variable-gain amplifier, said output of said second variable-gain amplifier, or a sum of said outputs of said first and second variable-gain amplifiers.

22. The ADPCM transcoder of claim 21 wherein said first and second tone generators are characterized as being infinite impulse response tone generators.

23. An adaptive differential pulse code modulation (ADPCM) codec comprising:
   an analog-to-digital converter having an input terminal for receiving an analog input signal, and an output terminal;
   a tone generator for providing a linear tone signal having at least one tone frequency associated therewith in response to a first control signal received at a control input terminal thereof;
   a pulse code modulation-(PCM-) to-linear converter having an input terminal coupled to said output terminal of said analog-to-digital converter, and an output terminal;
   a first multiplexer having a first input terminal coupled to said output terminal of said PCM-to-linear converter, a second input terminal for receiving said linear tone signal, a control input terminal for receiving a second control signal, and an output terminal;
   an ADPCM encoder having an input terminal coupled to said output terminal of said first multiplexer, and an output terminal for providing an ADPCM output signal;
   an ADPCM decoder having an input terminal for receiving an ADPCM input signal, and an output terminal;

a second multiplexer having a first input terminal coupled to said output terminal of said ADPCM decoder, a second input terminal for receiving said linear tone signal, a control input terminal for receiving a third control signal, and an output terminal;

a linear-to-PCM converter having an input terminal coupled to said output terminal of said second multiplexer, and an output terminal; and a digital-to-analog converter having an input terminal coupled to said output terminal of said linear-to-PCM converter, and an output terminal for providing an analog output signal.

24. The ADPCM codec of claim 23 further comprising a serial control port having an input terminal for providing a microprocessor interface, and a first output terminal coupled to said tone generator and providing said first control signal in response to a first plurality of signals received at said input terminal.

25. The ADPCM codec of claim 24 wherein said serial control port further has a second output terminal for providing said second control signal in response to a second plurality of signals received at said input terminal, and a third output terminal for providing said third control signal in response to a third plurality of signals received at said input terminal.

26. A method for generating a tone integrally within an adaptive differential pulse code modulation (ADPCM) transcoder, comprising the steps of:

generating a linear tone signal having at least one tone frequency associated therewith;

converting a digital pulse code modulation (PCM) input signal to a first linear signal;

selecting one of said first linear signal and said linear tone signal to provide a first selected signal;

providing said first selected signal to an input of an ADPCM encoder;

providing an output of said ADPCM encoder as an ADPCM output signal;

receiving an ADPCM input signal at an input of an ADPCM decoder;

selecting one of, a second linear signal at an output of said ADPCM decoder, and said linear tone signal, to provide a second selected signal; and converting said second selected signal to a digital PCM output signal.

27. The method of claim 26 further comprising the steps of:

converting an analog input signal to said digital PCM input signal; and converting said digital PCM output signal to an analog output signal.

28. The method of claim 27 wherein the step of converting said analog input signal to said digital PCM input signal further comprises the steps of:

bandpass filtering said analog input signal; and
converting said bandpass-filtered analog signal to said digital PCM input signal.

29. The method of claim 28 wherein the step of converting said digital PCM output signal to an analog output signal further comprises the step of lowpass filtering said analog output signal to provide a lowpass-filtered analog output signal.

30. The method of claim 26 wherein said step of generating said linear tone signal further comprises the step of generating said linear tone signal with a data processor.

31. A signal processing apparatus comprising:

a data processor having an input terminal for receiving an input signal, an output terminal, and an input/output terminal;

a serial control port having an input terminal coupled to said output terminal of said data processor, and an output terminal;

a signal encoder having a first input terminal for receiving a first digital signal, a second input terminal for receiving a first tone signal, a control input terminal coupled to said output terminal of said serial control port, and an output terminal for providing a transmit signal in response to either said first digital signal or to said first tone signal, as determined by said serial control port;

a signal decoder having a first input terminal for receiving a receive signal, a second input terminal for receiving a second tone signal, a control input terminal coupled to said output terminal of said serial control port, and an output terminal for providing a second digital signal in response to either said receive signal or to said second tone signal, as determined by said serial control port; and a tone generator having a control input terminal coupled to said output terminal of said serial control port, a first output terminal coupled to said signal encoder for providing said first tone signal, and a second output terminal coupled to said signal decoder for providing said second tone signal.

32. The signal processing apparatus of claim 31 wherein said signal encoder comprises:

a pulse code modulation-(PCM-) to-linear converter having an input terminal for receiving said first digital signal, and an output terminal;

a multiplexer having a first input terminal coupled to said output terminal of said PCM-to-linear converter, a second input terminal coupled to said first output terminal of said tone generator, a control input terminal coupled to said serial control port, and an output terminal; and an adaptive differential pulse code modulation (ADPCM) encoder having an input terminal coupled to said output terminal of said multiplexer, and an output terminal for providing said transmit signal.

33. The signal processing apparatus of claim 31 wherein said signal decoder comprises:

an ADPCM decoder having an input terminal for receiving said receive signal, and an output terminal;

a multiplexer having a first input terminal coupled to said output terminal of ADPCM decoder, a second input terminal coupled to said second output terminal of said tone generator, a control input terminal coupled to said serial control port, and an output terminal; and a linear-to-PCM converter having an input terminal for coupled to said output terminal of said multiplexer, and an output terminal for providing said second digital signal.

34. The signal processing apparatus of claim 31 further comprising a time division duplex block having an input terminal for receiving said transmit signal, an output terminal for providing said receive signal, a first input/output terminal coupled to said data processor, and a second input/output terminal for conducting data packets thereon, said data packets comprising transmit data packets formed from said transmit signal, and receive data packets forming said receive signal.

35. The signal processing apparatus of claim 31 further comprising:
- an analog-to-digital converter having an input terminal for receiving a voice input signal, and an output terminal coupled to said input terminal of said signal encoder; and
- a digital-to-analog converter having an input terminal coupled to said output terminal of said signal decoder, and an output terminal for providing a voice output signal.

36. The signal processing apparatus of claim 31 wherein said input signal is characterized as being a keypad input signal.

37. A signal processing apparatus comprising:
- a data processor having an input terminal for receiving an keypad input signal, an output terminal, and an input/output terminal;
- a pulse code modulation (PCM) codec having a first input terminal for receiving a voice input signal and a first output terminal for providing a first digital signal in response to said voice input signal, and a second input terminal for receiving a second digital signal and a second output terminal for providing a voice output signal in response to said second digital signal;
- an ADPCM transcoder having a first input terminal for receiving said first digital signal and a first output terminal for providing a transmit signal in response to said first digital signal, a control input terminal coupled to said output terminal of said data processor, a second input terminal for receiving a receive signal and a second output terminal for providing said second digital signal in response to said receive signal;
- said ADPCM transcoder including means responsive to said data processor for inserting a tone signal having at least one tone frequency associated therewith into one of either a receive signal stream and a transmit signal stream as selected by said data processor.

38. The signal processing apparatus of claim 37 wherein said ADPCM transcoder comprises:
- a serial control port having an input terminal coupled to said output terminal of said data processor, and an output terminal;
- a signal encoder having a first input terminal for receiving a first digital signal, a second input terminal for receiving a first tone signal, a control input terminal coupled to said output terminal of said serial control port, and an output terminal for providing a transmit signal in response to either said first digital signal or to said first tone signal, as determined by said serial control port;
- a signal decoder having a first input terminal for receiving a receive signal, a second input terminal for receiving a second tone signal, a control input terminal coupled to said output terminal of said serial control port, and an output terminal for providing a second digital signal in response to either said receive signal or to said second tone signal, as determined by said serial control port; and
- a tone generator having a control input terminal coupled to said output terminal of said serial control port, a first output terminal coupled to said signal encoder, and a second output terminal coupled to said signal decoder.

39. The signal processing apparatus of claim 38 further comprising a time division duplex block having an input terminal for receiving said transmit signal, an output terminal for providing said receive signal, a first input/output terminal coupled to said data processor, and a second input/output terminal for conducting data packets thereon.

* * * * *